(12) United States Patent
Storino et al.

(10) Patent No.: US 6,188,247 B1
(45) Date of Patent: Feb. 13, 2001

(54) METHOD AND APPARATUS FOR ELIMINATION OF PARASITIC BIPOLAR ACTION IN LOGIC CIRCUITS FOR HISTORY REMOVAL UNDER STACK CONTENTION INCLUDING COMPLEMENTARY OXIDE SEMICONDUCTOR (CMOS) SILICON ON INSULATOR (SOI) ELEMENTS

(75) Inventors: Salvatore N. Storino; Jeff Van Tran, both of Rochester, MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/239,289

(22) Filed: Jan. 29, 1999

(51) Int. Cl.[7] .................................................. H03K 19/096
(52) U.S. Cl. ................................ 326/98; 326/98; 326/95; 326/93; 326/14; 326/15
(58) Field of Search .................................. 326/98, 95, 93, 326/104, 14, 15

(56) References Cited

U.S. PATENT DOCUMENTS

| | | | |
|---|---|---|---|
| 4,893,158 | 1/1990 | Mihara et al. | 357/23.13 |
| 5,627,395 | 5/1997 | Witek et al. | 257/350 |
| 5,742,075 | 4/1998 | Burns et al. | 257/59 |
| 5,748,016 * | 5/1998 | Kurosawa | 307/108 |
| 5,770,881 * | 6/1998 | Pelella et al. | 257/347 |
| 5,777,491 * | 7/1998 | Hwang et al. | 326/113 |
| 5,793,228 * | 8/1998 | Evans | 326/98 |
| 5,831,451 * | 11/1998 | Bosshart | 326/93 |
| 5,917,355 * | 6/1999 | Klass | 327/208 |
| 5,923,071 | 7/1999 | Saito | 257/458 |
| 5,932,914 | 8/1999 | Horiguchi | 257/355 |
| 5,982,006 | 11/1999 | Joyner | 257/347 |
| 5,985,728 | 11/1999 | Jennings | 438/311 |
| 5,994,738 | 11/1999 | Wollesen | 257/347 |
| 6,002,271 * | 12/1999 | Chu et al. | 326/98 |
| 6,020,222 | 2/2000 | Wollesen | 438/149 |
| 6,023,089 | 2/2000 | Kang | 257/347 |
| 6,028,337 | 2/2000 | Letavic et al. | 257/347 |
| 6,031,261 | 2/2000 | Kang . | |
| 6,034,399 | 3/2000 | Brady et al. | 257/355 |
| 6,094,072 | 7/2000 | Davies et al. | 326/98 |

FOREIGN PATENT DOCUMENTS

| | | |
|---|---|---|
| 6-112483 | 4/1994 | (JP) . |
| 6-204440 | 7/1994 | (JP) . |
| 6-209109 | 7/1994 | (JP) . |

OTHER PUBLICATIONS

"Pre–Discharge Technique to Improve Noise Immunity on Silicon–on–Insulator (SOI) Domino Circuits", Reseach Disclosure, Apr. 1998 No. 408, pp. 496–497, Disclosed by International Business Machines Corporation.

* cited by examiner

*Primary Examiner*—Michael Tokar
*Assistant Examiner*—Vibol Tran
(74) *Attorney, Agent, or Firm*—Merchant, Gould, Smith, Edell, Welter & Schmidt; Roy W. Truelson

(57) ABSTRACT

The present invention is an apparatus and method to overcome the unwanted effects of parasitic bipolar discharge in silicon-on-insulator (SOI) field effect transistors (FET) by eliminating the effects the sneak current discharging path by applying a contention free arrangement methodology to realize the dynamic logic circuit. The SOI MOS devices are arranged so as to eliminate the effects of electrical connections between certain intermediate nodes of the dynamic logic circuit. Accordingly, eliminating any parasitic bipolar current leakage paths associated with such electrical connections between certain intermediate nodes of said stacked SOI MOS devices of said dynamic circuit.

37 Claims, 4 Drawing Sheets

US 6,188,247 B1

METHOD AND APPARATUS FOR ELIMINATION OF PARASITIC BIPOLAR ACTION IN LOGIC CIRCUITS FOR HISTORY REMOVAL UNDER STACK CONTENTION INCLUDING COMPLEMENTARY OXIDE SEMICONDUCTOR (CMOS) SILICON ON INSULATOR (SOI) ELEMENTS

BACKGROUND OF THE INVENTION

A. Field of the Invention

The invention relates generally to a method and apparatus for reducing the effects of parasitic bipolar discharge of silicon-on-insulator (SOI) electronic devices. More specifically, the invention relates to eliminating the unwanted effect of parasitic bipolar discharge of SOI field effect transistors (FET) in dynamic logic circuits.

B. Description of Related Art

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

In recent years Metal Oxide Semiconductor (MOS) Field Effect Transistor (FET) integrated circuits and Complementary Metal Oxide Semiconductor (CMOS) FETs have gained popularity and are the most widely used type of integrated circuit technology. Today, CMOS electronic devices provide advantages of higher operating speeds, smaller size, lower power consumption, and are increasingly becoming cheaper to manufacture as a result of smaller component size, higher manufacturing production yields per semiconductor wafer, and larger wafer sizes. The most popular integrated circuit devices manufactured utilizing CMOS technology are microprocessors, memory, and digital logic circuits.

Traditional MOS and CMOS semiconductors consist of a metal on an oxide layer that is placed on a silicon substrate. The added impurities in the silicon substrate enable these devices to operate as transistors. On the other hand, SOI semiconductors include a thin layer of silicon placed on top of an insulator, such as silicon oxide or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. Therefore, with SOI technology faster MOS transistors can be manufactured resulting in higher performance semiconductors to fuel emerging needs for faster electronic devices.

SOI technology has several drawbacks. An inherent drawback of placing a MOS transistor on top of a SOI layer is that the MOS transistor is actually placed in parallel with a bipolar junction transistor. If enough current is passed through the MOS transistor, the parasitic bipolar transistor will turn on. This causes an unwanted effect called bipolar discharge and lowers the performance of the MOS transistor.

High speed CMOS circuits often employ a domino circuit technique that utilizes pre-charging to improve the gate speeds of the transistors. Dynamic circuit nodes are pre-charged during each clock cycle to a certain level. The problem with SOI FETs is that the parasitic bipolar transistor causes bipolar discharge. This is undesirable because it causes an unintended loss of charge on the drain nodes of the dynamic circuit.

Normally, parasitic bipolar action does not manifest itself in conventional, bulk, MOS transistors because the base of the bipolar transistor is always kept at ground potential, keeping the bipolar off. In SOI, the body of the MOS FET device, or base of the bipolar transistor, is floating and can be charged high by junction leakages induced when the drain and source terminals of the MOS FET are at a high potential. Subsequently, if the source is pulled to a low potential, the trapped charge in the base area is available as parasitic base current. The parasitic base current activates the bipolar transistor and generates a collector current at the drain terminal of the MOS FET. The unintentional loss of charge could lead to system failure, for example, by erroneously switching logic state.

It will be appreciated by those skilled in the art that a technique for eliminating parasitic bipolar discharge in MOS FET devices can be provided as discussed in U.S. patent application Ser. No. 09/240,244, filed Jan. 29, 1999, and entitled "Method And Apparatus For Elimination Of Parasitic Bipolar Action In Complementary Oxide Semiconductor (CMOS) Silicon On Insulator (SOI) Circuits," the disclosure of which is hereby incorporated herein by reference.

It will also be appreciated by those skilled in the art that a technique for eliminating parasitic bipolar discharge in logic circuits including CMOS SOI devices can be provided as discussed in U.S. patent application Ser. No. 09/240,991, filed Jan. 29, 1999, and entitled "Method And Apparatus For Elimination Of Parasitic Bipolar Action In Logic Circuits Including Complementary Oxide Semiconductor (CMOS) Silicon On Insulator (SOI) Elements," the disclosure of which is also hereby incorporated herein by reference.

The active discharging device effectively pre-discharges nodes in SOI MOS FET dynamic logic circuits to prevent the parasitic bipolar transistor from activating. However, in some embodiments of dynamic logic gates pre-discharging nodes is not always effective. Under certain input logic signal conditions a "sneak" bipolar leakage current path is created whenever intermediate nodes of the dynamic logic circuit are interconnected.

FIG. 3 illustrates a pre-discharged SOI domino logic circuit 44 that implements a logic function whose output may be determined according to:

$$OUT=NOT\{(A+B)*(A1+B1)\}.$$

FIG. 3 illustrates but one specific embodiment of a logic circuit. However, it will be appreciated by those skilled in the art that various implementations of logic functions and circuits such as AND, OR, NOR, NAND, EXCLUSIVE-OR, etc. and combinations thereof can be realized that have the characteristics in accordance with those illustrated in FIG. 3, namely a pre-discharged SOI domino logic circuit wherein a sneak current discharge path exists. Under certain states of logic inputs A, A1, B and B1, conductive path 66, located between nodes 48 and 50, may discharge transistors 68 or 64 to a circuit common node 62, or ground. In domino circuit 44, as illustrated in FIG. 3, the sneak path exists whenever input A is in a logic low state, B is in a logic high state and A1 and B1 are in logic low states. Given that the clock (CLK) has charged node 56 to a logic high state and is turned off, the sneak path exists from charge loss on node 56 to circuit common (ground) 62 via transistors 60 and 64. Since both A1 and B1 are in a logic low state the domino circuit 44 should not have "evaluated" or discharged node 56. Positive Channel-Field Transistors (PFETs) 64 and 68 were intended to discharge nodes 48 and 50, respectively to disable the bipolar effects of Negative Channel-Field Effect Transistors (NFETs) 58 and 60, respectively. Thus, it can be seen that since there is a conductive path 66 connecting intermediate nodes 48 and 50, the sneak path will provide a parasitic bipolar discharge path between intermediate nodes 48 and 50 of the dynamic logic circuit 44.

As a result, it can be seen that there is a need to minimize the effect of parasitic bipolar transistors in parallel with MOS transistors in dynamic logic circuits.

Moreover, it can also be seen that there is a need to eliminate parasitic bipolar action in dynamic logic circuits with at least one set of interconnected intermediate nodes that provide a current leakage path.

SUMMARY OF THE INVENTION

The present invention relates generally to a method and apparatus for reducing the effects of parasitic bipolar discharge of silicon-on-insulator (SOI) devices. More specifically, the present invention relates to eliminating the unwanted effect of parasitic bipolar discharge of SOI field effect transistors (FET) in dynamic logic circuits where pre-discharging of nodes will not be effective because a sneak path exists under certain dynamic logic circuit input conditions.

In accordance with a preferred embodiment, the present invention provides an apparatus and method to overcome the unwanted effects of parasitic bipolar discharge in silicon-on-insulator (SOI) field effect transistors (FET) by expanding a stack of SOI MOS devices arranged to provide a predetermined logic function. The SOI MOS devices are arranged so as to eliminate the effects of electrical connections between certain intermediate nodes of the dynamic logic circuit. Accordingly, eliminating any parasitic bipolar current leakage paths associated with such electrical connections between certain intermediate nodes of said stacked SOI MOS devices of said dynamic circuit.

In one embodiment, the present invention provides an apparatus with reduced bipolar transistor action including a dynamic logic circuit and a Silicon on Insulator(SOI) Metal Oxide Semiconductor (MOS) device. The apparatus comprises a plurality of stacked SOI MOS devices interconnected to perform a predetermined logic function defining a shared node and a plurality of intermediate nodes; and a plurality of series connected active discharging devices interconnected between said intermediate nodes and any one of corresponding inputs to said stacked SOI MOS devices; wherein said plurality of stacked SOI MOS devices are arranged so as to eliminate any parasitic bipolar transistor current leakage path.

In another embodiment, the present invention provides, a method of providing an apparatus with reduced bipolar transistor action including a dynamic logic circuit and a Silicon on Insulator(SOI) Metal Oxide Semiconductor (MOS) device. The method comprises providing a plurality of stacked SOI MOS devices interconnected to perform a predetermined logic function defining a shared node and a plurality of intermediate nodes; providing a plurality of series connected active discharging devices interconnected between said intermediate nodes and any one of corresponding inputs to said stacked SOI MOS devices; and arranging said plurality of stacked SOI MOS devices so as to eliminate any parasitic bipolar transistor current leakage path.

In yet another embodiment, the present invention provides a method of eliminating parasitic bipolar transistor action in an apparatus including a dynamic logic circuit performing a predetermined logic output function. The dynamic logic circuit further including a plurality of Silicon on Insulator (SOI) Metal Oxide Semiconductor (MOS) devices and the dynamic logic circuit defining a plurality of interconnected intermediate nodes providing an electrical conductive path between the intermediate nodes. The method comprises providing a plurality of said SOI MOS devices operatively coupled to a plurality of series connected active discharging devices; eliminating the effects of said conductive path between said nodes coupling said SOI MOS devices; and maintaining said predetermined logic output function; whereby said parasitic bipolar action of said SOI MOS devices are deactivated.

These and various other features and advantages of the present invention will become readily apparent to those skilled in the art from the following detailed description and corresponding drawings. As will be realized, the invention is capable of modification without departing from the invention. Accordingly, the drawing and description are to be regarded as being illustrative in nature, and not as restrictive.

DETAILED DESCRIPTION OF THE ILLUSTRATED EMBODIMENTS

The illustrated embodiment of the invention is directed to reducing or eliminating the unwanted effects of the parasitic bipolar transistor in silicon-on-insulator (SOI) field effect transistor (FET) dynamic logic circuits. The dynamic logic circuit may have an input, an output, a clock, and a plurality of stacked SOI Metal Oxide Semiconductor (MOS) FETs interconnected to perform logic functions defining a shared node, said shared node coupled to a pre-charging device, a plurality of intermediate nodes having a corresponding input coupled to said stacked transistors; and a plurality of active discharging transistors interconnected between said intermediate nodes and any one of said corresponding input to said stacked transistors. The discharging devices actively discharge the intermediate nodes of the stacked SOI FETs during the pre-charge phase of dynamic logic circuits, whereby the parasitic bipolar transistor is deactivated and the charge on the shared node is maintained at a high potential level during the pre-charge phase of dynamic logic circuits.

However, in certain logic configurations a sneak current discharging path may be present whereby the intermediate nodes of the stacked SOI FETs are discharged during the pre-charge phase of dynamic logic circuits via a sneak current discharging path to a circuit common or ground. Accordingly, the illustrated embodiment is directed at eliminating the effects of the sneak current discharging path by applying contention free arrangement methodology to realize the dynamic logic circuit.

Figure 1:
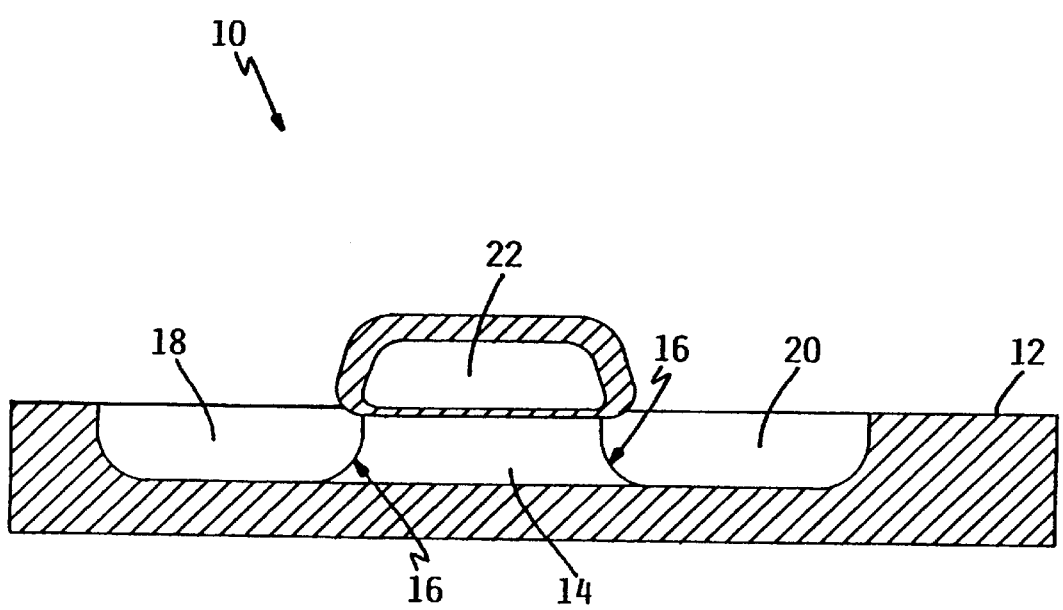
FIG. 1 is a cross sectional diagram of a silicon-on-insulator (SOI) field effect transistor (FET) and a parasitic bipolar transistor.

FIG. 1 illustrates a cross sectional view of a silicon-on-insulator (SOI) negative field effect transistor (NFET) 10 and a parasitic bipolar transistor. The NFET 10 is built on an insulator 12, e.g. of silicon dioxide, i.e. glass. In bulk (non SOI) the base region of the parasitic bipolar transistor is always maintained at ground potential. Therefore, no base current is generated and no resulting collector current flows through the bipolar device.

However, in SOI transistors, the body of the FET device 14, or base region of the parasitic bipolar transistor, which lies beneath the gate 22 of the NFET, is floating. The body 14 of the transistor can become charged to a high potential by junction 16 leakage induced whenever both the drain 18 and source 20 terminals are at a high potential. In this illustration the drain 18 of the NFET is the n+ or collector region of the parasitic bipolar and the source 20 is the n+ or emitter region of the parasitic bipolar.

If the body 14 of the FET charges to a high potential and the source 20 is pulled to a low potential, the trapped charge in the body 14, or base region, becomes available as parasitic base current. If the parasitic base current is of sufficient magnitude it will activate the parasitic bipolar transistor and thus generate a collector current at the drain 18. The collector current, flowing in parallel with the drain 18 current, is undesirable as it causes a loss of charge at the drain 18 node of the dynamic circuit.

Figure 2:
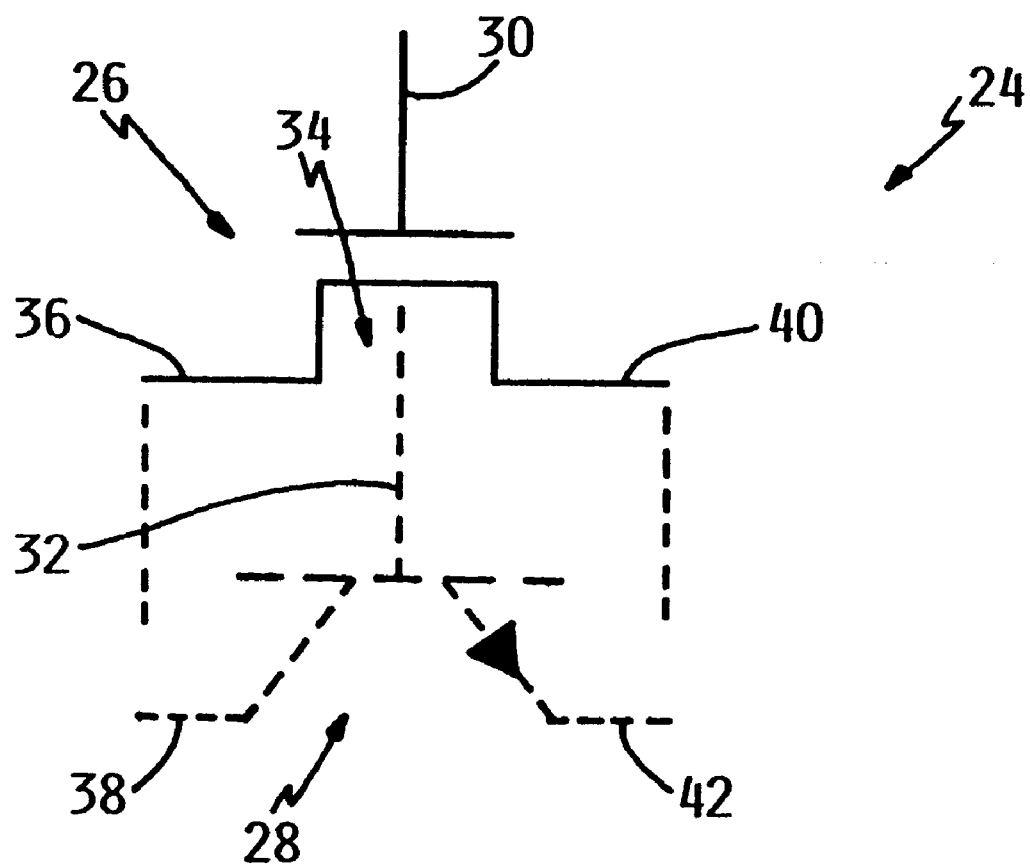
FIG. 2 is an equivalent schematic diagram of the SOI field effect transistor FET and bipolar transistor.

FIG. 2 illustrates an equivalent schematic diagram 24 of the SOI field effect transistor NFET 26 and the parallel parasitic bipolar NPN transistor 28. The gate terminal 30 of NFET 26 is equivalent to the base terminal 32 of the parasitic bipolar transistor 28 and is located at the body 34 of NFET 26. The drain 36 of NFET 26 is equivalent to the collector 38 of the parasitic bipolar transistor 28. Accordingly, the source 40 of NFET 26 is equivalent to the emitter 42 of the parasitic bipolar transistor 28. The body 34 of NFET 26 becomes charged by induced leakage whenever the drain 36 and source 40 terminals are held at a high potential. If the source 40 is dropped to a low potential the trapped charged in the body 34 causes a current to flow into the base 32 of the parasitic bipolar transistor 28. This causes a current to flow in the collector 38 that is parallel to a current flowing in the drain 36. This action discharges the drain 36 node of a dynamic circuit.

Figure 3:
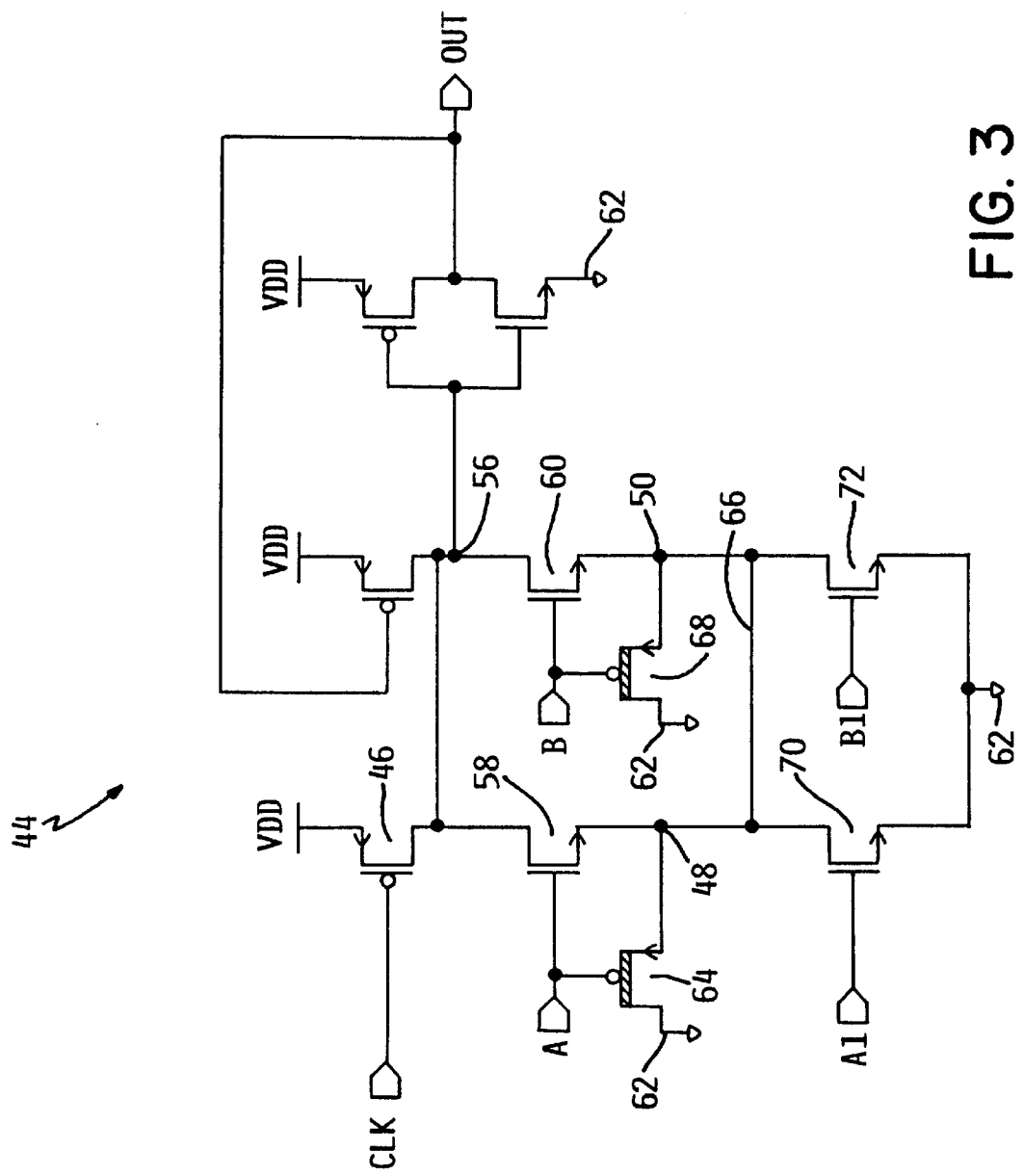
FIG. 3 is a schematic of a pre-discharged SOI dynamic logic circuit schematic diagram including unwanted sneak current discharging path.
Figure 4:
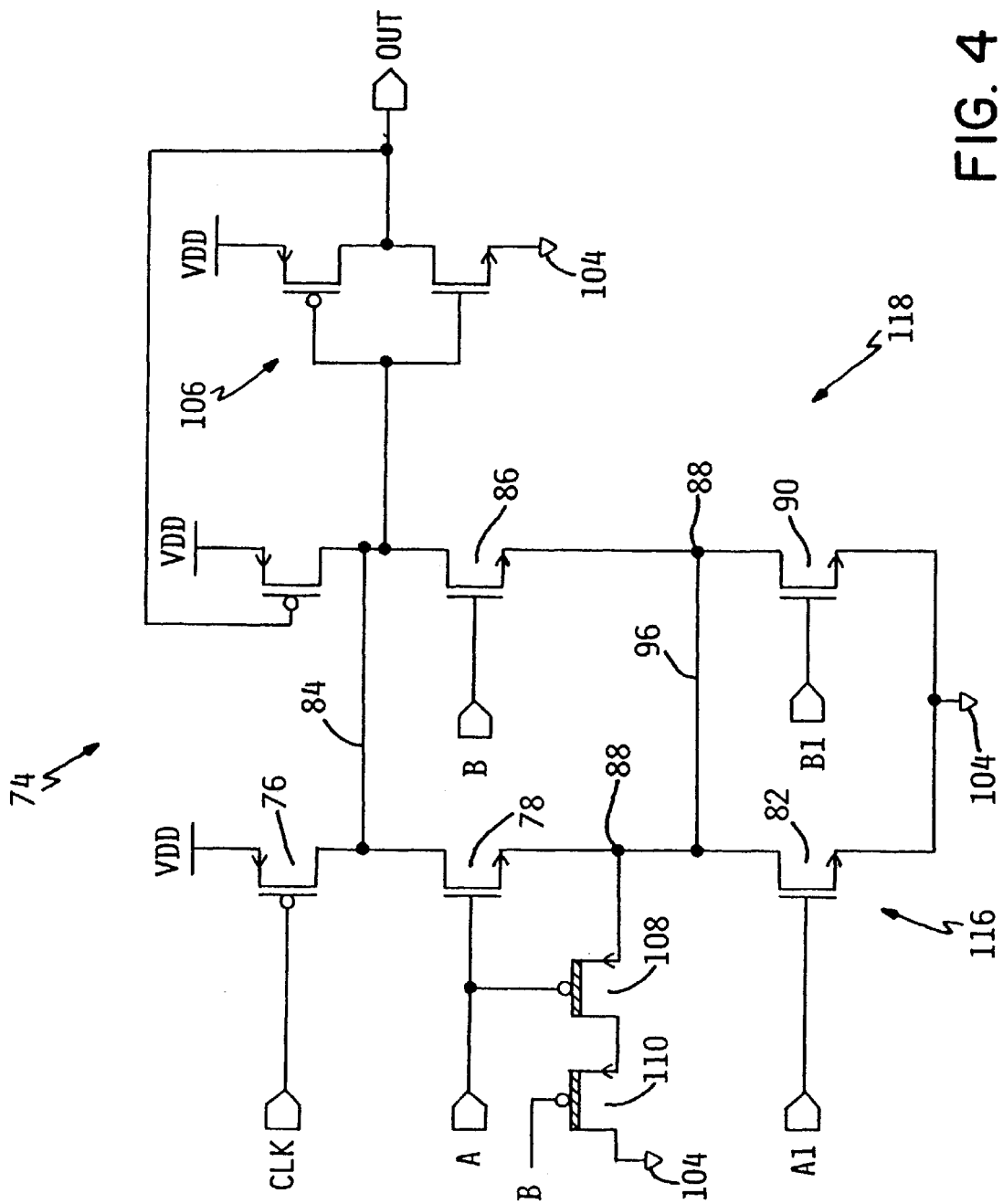
FIG. 4 is a schematic diagram of a dynamic circuit contention free arrangement methodology to eliminate the effects of the sneak current discharging path.

FIG. 4 is a schematic diagram of a dynamic logic circuit 74 illustrating one embodiment of the present invention. Dynamic logic circuit 74 eliminates the unwanted effects of the sneak current leakage path from pre-discharging transistors 68 (FIG. 3) or 64 (FIG. 3) through conductive path 66 (FIG. 3) to a logic circuit common node 62 (FIG. 3) under certain states of logic inputs A, A1, B and B1 (all in FIG. 3).

In one embodiment the present invention provides a dynamic circuit 74 that eliminates unwanted effects of the sneak current path created by conductive path 66 (FIG. 3) by removing active discharging transistor 68 (FIG. 3) and including transistor 68 (FIG. 3) in a series electrical connection with active discharging transistor 64 (FIG. 3).

The resulting contention free methodology is illustrated in FIG. 4. Dynamic logic circuit 74 eliminates the effects of the sneak current discharging path by making the operation of discharging node 88 contention free of enabling input signals A or B.

When input logic signals A or B are set to a logic high state, the series connection of PFET active discharging transistors 108 and 110 is broken. Accordingly, intermediate node 88 cannot be discharged to circuit common node 104, or ground. Those skilled in the art will appreciate that NFET transistors 82 and 90 cannot discharge their respective parasitic bipolar transistors when their source terminals are at ground potential. As a result, intermediate node 88 will be charged to a high potential by inputs A or B.

When both input logic signals A and B are set to a logic low state, the series connected PFET active discharging transistors 108 and 110 will discharge node 88 to circuit common node 104. Accordingly, those skilled in the art will appreciate that NFET transistors 82 and 90 will discharge their respective parasitic bipolar transistors to circuit common node 104.

Transistor stack 116 is comprised of NFET transistors 78 and 82, defining an intermediate node 88 where the source of transistor 78 is electrically connected to the drain of transistor 82. It will be appreciated by those skilled in the art that electrical conductor 96 connects the sources of NFET transistors 78 and 86 to the drains of NFET transistors 82 and 90, respectively, accordingly defining node 88. As described above, PFET transistors 108 and 110 discharges node 88 to circuit common or ground 104 at certain predefined input logic levels appearing at inputs A and B. Thus disabling the bipolar effects of NFET transistor 78 and 86 and maintaining a charge on shared node 84 during the pre-charging phase of dynamic logic circuits.

In response to a clock signal (CLK) transistor 76 pre-charges shared node 84. Node 84 is shared by the drain terminals of transistors 78 and 86 of transistor stacks 116 and 118, respectively. Logic inputs A and A1 are provided to the gate terminals of transistors 78 and 82 of stack 116, respectively. Inputs A and A1 represent the same inputs A and A1, respectively, as illustrated in FIG. 3.

Similarly, stack 118 is comprised of transistors 86 and 90 that are tied to intermediate node 88. The pre-discharging function of transistors 108 and 110, in response to logic inputs A and B, disables the bipolar effects of NFET transistor 86, thus maintaining a charge on shared node 84. Logic inputs B and A1 are provided to gate terminals of transistors 86 and 90, respectively. These logic inputs B and A1 also represent the same logic inputs B and A1, respectively, as illustrated in FIG. 3.

The CLK input is tied to a PFET 76 through its gate input terminal. When the input CLK signal is active low, PFET 76 turns on and charges shared drain node 84 to a high potential. This is referred to as the pre-charge phase in dynamic logic circuits. During the pre-charge phase inputs A, A1, B and B1 are set to logic low states. During the logic low state, PFETs 108 and 110 turn on and conduct current from intermediate node 88 to the dynamic circuit's common node 104. During the pre-charge phase, PFETs 108 and 110 actively discharge intermediate node 88. Accordingly, the bodies of NFETs 78, 82, 86 and 90 cannot charge to a high potential. Therefore, the parasitic bipolar transistors in parallel with these NFETs cannot activate because a sufficient amount of charge cannot build up in the bodies of these transistors to generate an adequate amount of base current to flow into the base of the parasitic bipolar transistors. By preventing the parasitic bipolar transistors from activating, the charge on the shared drain node 84 is protected from being unintentionally discharged.

It will be appreciated by those skilled in the art that, given the symmetry of the FET devices, similar results could be achieved if the stacks were replaced with PFETs and active discharging transistors, PFETs 108 and 110, were replaced with equivalent NFETs and interconnected to perform the function of pre-charging the intermediate node 88 of the transistor stacks.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. An apparatus with reduced bipolar transistor action including a dynamic logic circuit and a Silicon on Insulator (SOI) Metal Oxide Semiconductor (MOS) device, comprising:
   a plurality of stacked SOI MOS devices interconnected to perform a predetermined logic function defining a shared node and an intermediate node; and
   a plurality of series connected active discharging devices defining a discharge path between said intermediate node and a common discharge potential, said plurality of series connected active discharging devices being controlled by respective inputs to said stacked SOI MOS devices;
   wherein said plurality of series connected active discharging devices selectively discharge said intermediate node through said discharge path to said common discharge potential to eliminate parasitic bipolar transistor action in said stacked SOI MOS devices.

2. The apparatus according to claim 1, further comprising a pre-charging device coupled to said dynamic logic circuit.

3. The apparatus according to claim 2, wherein said pre-charging device is coupled to said shared node.

4. The apparatus according to claim 3 wherein said pre-charging device is a Field Effect Transistor.

5. The apparatus according to claim 1, wherein said stacked SOI MOS devices are coupled to a corresponding logic input.

6. The apparatus according to claim 1 wherein the SOI MOS electronic devices further comprise transistors.

7. The apparatus according to claim 6 wherein said transistors are N type Field Effect Transistors (NFET).

8. The apparatus according to claim 6 wherein said transistors are P type Field Effect Transistors (PFET).

9. The apparatus according to claim 6 wherein said stacked transistors further comprise:
   a first transistor having a body, a drain terminal, a source terminal, and a gate input terminal;
   a second transistor having a body, a drain terminal, a source terminal, and a gate input terminal; and
   said first and second transistors being operatively coupled.

10. The apparatus according to claim 9 wherein said source terminal of said first transistor is coupled to said drain terminal of said second transistor defining a node.

11. The apparatus according to claim 10 wherein said active discharging device is a transistor having
   a drain operatively coupled to said defined node;
   a gate operatively coupled to said gate input terminal; and
   a source operatively coupled to a circuit common node.

12. The apparatus according to claim 11 wherein said transistors are N type Field Effect Transistors (NFET) and said active discharging device is a P type Field Effect Transistors (PFET).

13. The apparatus according to claim 11 wherein said transistors are P type Field Effect Transistors (PFET) and said active precharging device is a N type Field Effect Transistors (NFET).

14. The apparatus according to claim 11 further comprising a plurality of said stacked transistors.

15. The apparatus according to claim 14 wherein said plurality of said stacked transistors are connected in a parallel configuration.

16. The apparatus according to claim 15 wherein said stacked transistors are N type Field Effect Transistors (NFET) and said active discharging devices are P type Field Effect Transistors (PFET).

17. The apparatus according to claim 15 wherein said stacked transistors are P type Field Effect Transistors (PFET) and said active precharging device are N type Field Effect Transistors (NFET).

18. A method of providing an apparatus with reduced bipolar transistor action including a dynamic logic circuit and a Silicon on Insulator (SOI) Metal Oxide Semiconductor (MOS) device, the method comprising:
   providing a plurality of stacked SOI MOS devices interconnected to perform a predetermined logic function defining a shared node and an intermediate node;
   providing a plurality of series connected active discharging devices defining a discharge path between said intermediate node and a common discharge potential, said plurality of series connected active discharging devices being controlled by respective inputs to said stacked SOI MOS devices; and
   arranging said plurality of series connected active discharging devices to selectively discharge said intermediate node to said common discharge potential to eliminate parasitic bipolar transistor action in said stacked SOI MOS devices.

19. The method according to claim 18, wherein said step of providing a plurality of stacked SOI MOS devices further includes providing a pre-charging device coupled to said dynamic circuit.

20. The method according to claim 19, comprising coupling said pre-charging device to said shared node.

21. The method according to claim 19 wherein said pre-charging device is a Field Effect Transistor.

22. The method according to claim 18 wherein providing said SOI MOS electronic devices further includes providing transistors.

23. The method according to claim 22 wherein said transistors are N type Field Effect Transistors (NFET).

24. The method according to claim 22 wherein said transistors are P type Field Effect Transistors (PFET).

25. The method according to claim 22 wherein said step of providing said stacked transistors further comprises:
   providing a first transistor having a body, a drain terminal, a source terminal, and a gate input terminal;
   providing a second transistor having a body, a drain terminal, a source terminal, and a gate input terminal; and
   operatively coupling said first and second transistors.

26. The method according to claim 25 further comprising coupling said source terminal of said first transistor to said drain terminal of said second transistor defining a node.

27. The method according to claim 26 wherein said active discharging device is a transistor comprising
   operatively coupling a drain of said transistor to said defined node;
   operatively coupling a gate of said transistor to said gate input terminal; and operatively coupling a source of said transistor to a circuit common node.

28. The method according to claim 27 wherein said transistors are N type Field Effect Transistors (NFET) and said active discharging device is a P type Field Effect Transistors (PFET).

29. The method according to claim 27 wherein said transistors are P type Field Effect Transistors (PFET) and said active precharging device is a N type Field Effect Transistors (NFET).

30. The method according to claim 27 further comprising providing a plurality of said stacked transistors.

31. The method according to claim 30 wherein providing said plurality of said stacked transistors comprises connecting said stacked transitors in a parallel configuration.

32. The method according to claim 31 wherein said stacked transistors are N type Field Effect Transistors (NFET) and said active discharging devices are P type Field Effect Transistors (PFET).

33. The method according to claim 31 wherein said stacked transistors are P type Field Effect Transistors (PFET) and said active precharging device are N type Field Effect Transistors (NFET).

34. A Silicon on Insulator (SOI) Metal Oxide Semiconductor (MOS) circuit for implementing a logic function, comprising:

a precharge node precharged by a precharge device;

an output device coupled to said precharge node;

a logic network, said logic network selectively discharging said precharge node to a common discharge potential in response to a plurality of inputs to implement a pre-defined logic function, said logic network comprising an intermediate node; and an active discharge path from said intermediate node to said common discharge potential, said active discharge path selectively discharging said intermediate node to said common discharge potential to prevent parasitic bipolar transistor action.

35. The SOI MOS circuit of claim 34, wherein said active discharge path comprises a plurality of field effect transistors being arranged in series, the source of a first of said plurality of field effect transistors being coupled to said common discharge potential, the drain of a second of said plurality of field effect transistors being coupled to said intermediate node, said active discharge path running from the source of said second transistor to the drain of said first transistor, the gates of said first and second transistors being coupled to respective inputs of said plurality of inputs of said logic network.

36. The SOI MOS circuit of claim 34, wherein said logic network includes a plurality of parallel paths from said precharge node to said intermediate node, each path comprising a respective field effect transistor having a drain, a source coupled to said intermediate node and a gate coupled to a respective input of said plurality of inputs of said logic network, each said path running from said precharge node to the drain of the respective field effect transistor.

37. The SOI MOS circuit of claim 36, wherein each said logic network includes a plurality of parallel paths from said precharge node to said intermediate node, each path comprising a respective field effect transistor having a drain, a source coupled to said intermediate node and a gate coupled to a respective input of said plurality of inputs of said logic network, each said path running from said precharge node to the drain of the respective field effect transistor.

* * * * *